United States Patent [19]

Goff

[11] Patent Number: 5,659,308
[45] Date of Patent: Aug. 19, 1997

[54] KEYBOARD SCAN CODE TRANSLATION SYSTEM AND METHOD

[75] Inventor: Lonnie C. Goff, Tempe, Ariz.

[73] Assignee: VLSI Technology, Inc., San Jose, Calif.

[21] Appl. No.: 752,724

[22] Filed: Nov. 19, 1996

Related U.S. Application Data

[63] Continuation of Ser. No. 488,700, Jun. 9, 1995, abandoned.
[51] Int. Cl.$^6$ ................................................. H03K 17/94
[52] U.S. Cl. ........................ 341/26; 341/23; 364/709.16
[58] Field of Search ................................. 341/26, 20, 22, 341/23; 364/709.01, 709.12, 709.16

[56] References Cited

U.S. PATENT DOCUMENTS

| | | | |
|---|---|---|---|
| 3,706,973 | 12/1972 | Acquadro et al. | 345/172 |
| 4,470,038 | 9/1984 | Amano et al. | 341/26 |
| 5,450,078 | 9/1995 | Silva et al. | 341/26 |
| 5,486,823 | 1/1996 | Tsai | 341/26 |

*Primary Examiner*—Jeffery Hofsass
*Assistant Examiner*—Andrew Hill
*Attorney, Agent, or Firm*—LaValle D. Ptak

[57] ABSTRACT

Scan code generation for portable personal computers (PCs) using a matrix keyboard operates to produce keyboard output scan codes corresponding to IBM® compatible PC/AT scan codes. Key numbers are assigned to one or the other of two classes (simple and complex). Two classes of scan code translation tables (simple and complex) are stored in memory, either ROM or internal RAM memory. Whenever a simple key is operated, the simple table is accessed. The complex scan code table is addressed, in accordance with a set of seven edit rules, utilized in conjunction with the state of operation of multiple keys on the keyboard, to determine the appropriate translation. All of the logic needed to generate the necessary scan codes is collapsed into a structured table-driven mechanism.

11 Claims, 1 Drawing Sheet

KEYBOARD SCAN CODE TRANSLATION SYSTEM AND METHOD

This is a continuation of application Ser. No. 08/488,700, filed Jun. 9, 1995, now abandoned.

BACKGROUND

Since the introduction of personal computers, the computer keyboard has become substantially standardized, with a large number of keys. These keys include the ones previously associated with electric typewriters, along with additional function keys and special keys such as control keys, alternate keys, number lock, insert, home, end, cursor direction keys, etc. The result is a relatively large keyboard, typically occupying an area eight or nine inches side and seventeen to nineteen inches long. For desk-top personal computers (PCs), a keyboard of this size is no problem; and the keys are arranged in generally standard patterns. Whenever a key is operated, a signal is supplied from the keyboard to a keyboard microprocessor for effecting the desired operation. For some keys, such as "shift (SHFT), control (CTRL), and alternate (ALT), a combination of the operation of this key with other keys on the keyboard is used to effect the desired operation in the computer. The standard PC keyboard, which has been widely adopted, is based on the IBM® PC/AT scan code system.

Portable and lap-top personal computers (PCs) now are becoming increasingly popular. One of the primary advantages of such computers is their small size and weight, which permits them easily to be carried in briefcases or separately, if desired. These portable personal computers employ flat screen displays and, in efforts to reduce their sizes, employ keyboards with substantially fewer keys than are found in a standard desk-top personal computer system.

To provide all of the outputs to the computer which are obtainable from the larger desk-top keyboards described above, portable and lap-top PCs utilize a matrix keyboard arrangement. As portable or lap-top keyboards get smaller, single keys become a composite of several keys found on standard PC/AT keyboards. Depending upon the shift state of the keyboard, these keys dynamically generate different scan codes. This economizes the number of keys required and permits a reduction in size of the keyboard used with such computers.

Unfortunately, matrix keyboards used in personal computers do not currently have a standardized design. As a consequence, when these keyboards are used in conjunction with the programs, microprocessors and other circuitry designed for personal computers, a translation of the matrix keyboard coordinates into the standardized scan codes or keyboard signals for IBM® PC/AT keyboards must be effected. For different keyboards this required different software and scan code translation tables to be designed into the portable personal computer itself. In the past, a combination of in-line code design making and table translation has been employed to do this. No universal system, capable of operation with matrix keyboards having different assignments for various keys, has existed.

It is desirable to provide a system and method for a scan code generation system used with matrix keyboards which does not require new keyboard support software and hardware for each different matrix keyboard.

SUMMARY OF THE INVENTION

It is an object of this invention to provide an improved keyboard scan code generation system.

It is another object of this invention to provide an improved scan code generation method for matrix keyboards.

It is an additional object of this invention to provide an improved scan code generation system for generating key codes from a matrix keyboard.

It is a further object of this invention to provide an improved scan code generation system and method for generating key codes from a matrix keyboard by assigning unique complex key numbers to various composite keys in a table-driven system.

In accordance with a preferred embodiment of this invention, a scan code generation system, for generating key codes for a computer from a matrix keyboard, employs a first table memory to store a first keyboard scan code. A second table memory then is used to store a second keyboard scan code table; and the first and second tables may be designated as simple and complex tables. Whenever a key on a matrix keyboard is operated, a determination first is made whether the operation of that key addresses the simple table. If so, a scan code is generated from the simple table. If no matching key number is found in the simple table, then a check is made against the second or complex table, which generates scan codes in response to the operation of different combinations of keys on the keyboard. The scan code is generated by comparison of the current state of the keyboard against the keyboard state entry in conjunction with a fixed number of specific editing rules. The various keyboard states determine the editing rules, which then effect the scan code generation required for the operation of the computer.

DETAILED DESCRIPTION

Figure 1:
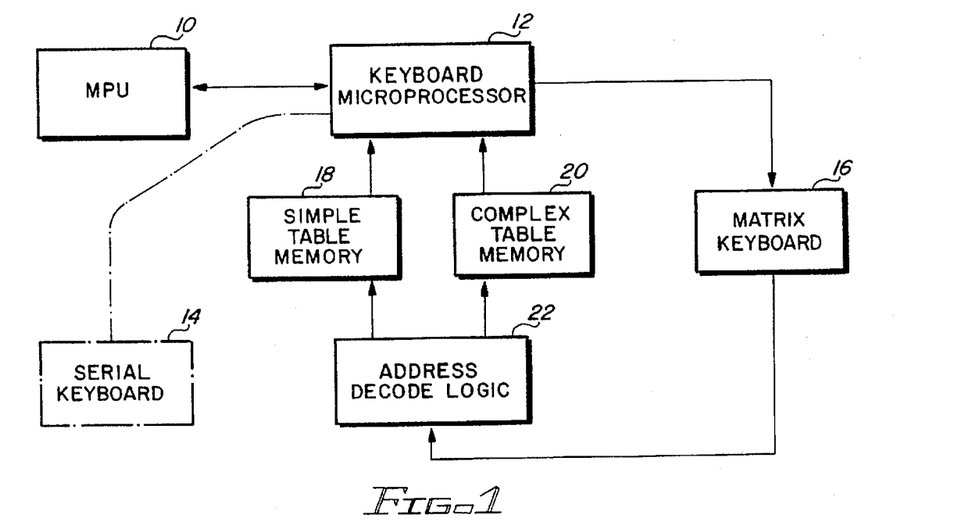
FIG. 1 is a block diagram of a system according to a preferred embodiment of the invention.

Reference now should be made to the drawing. FIG. 1 is a block diagram of a preferred embodiment of the invention. The circuit illustrated in FIG. 1 is typical of a portable lap-top personal computer (PC). Such a computer includes a main processing unit (MPU) 10 and a keyboard microprocessor 12. For a desk-top PC, a serial keyboard 14 (shown enclosed in dotted lines) operates to supply signals representative of the various key closures directly to the keyboard microprocessor 12, which then supplies the appropriate signals to the MPU 10 for operation of the programs in the computer.

As mentioned previously, however, a keyboard for portable computers, especially lap-top portables, necessarily is smaller than the standard serial keyboard 14. Such keyboards permit multiple functions from various keys; so that single keys of a standard serial keyboard 14 become a composite of several keys on a matrix keyboard 16 of the type typically used with lap-top personal computers. As a result, the shift state of the keyboard 16 causes different keys to dynamically generate different scan codes for processing by the keyboard microprocessor 12 for the MPU 10 of the computer. To permit the use of matrix keyboards 16 having different design configurations, employing different combinations of keys, to produce various scan codes, the system shown in FIG. 1 employs two scancode translation tables stored in ROM memory associated with the keyboard microprocessor 12 (or stored in internal RAM of the keyboard microprocessor 12). One of these table memories is a simple table memory 18; and the other is a complex table memory 20. Address decode logic 22 receives the signals (representative of the operation of a single key or a combination of several keys) from the matrix keyboard 16, and addresses the tables in the memories 18 and 20, which then produce translated scancode signals used by the microprocessor 12 to create the effect of a PC/AT compatible keyboard out of the scan matrix keyboard 16.

Since the scancode translation tables are stored in the table memories 18 and 20, different matrix keyboards 16 are supported by simply installing the necessary information in the table memories 18 and 20. Thus, no hardware or software changes need to be made to the system to support different types of matrix keyboards 16.

On lap-top scan matrix keyboards, some keys (simple keys) have a direct correspondence with similar keys on a standard PC/AT keyboard. Other single keys on a matrix keyboard 16 may be a composite of multiple keys on a standard PC/AT keyboard. Depending upon the shift state of the keyboard, these latter keys act like two or more different keys. To collapse this complexity into a simple translate table, unique key numbers are assigned to the composite keys. A matrix closure of a composite key of the system shown in FIG. 1, therefore, is mapped to a newly defined key number (selected as 128 to 255) instead of mapping to multiple key (old) numbers, depending upon the shift state of the keyboard. This mapping is effected through address decode logic 22 to select an address for either a simple table memory 18, corresponding to those keys which have a direct correlation with the corresponding key on a standard PC/AT keyboard, or to a complex memory table 20, corresponding to the newly defined key numbers (128 to 255) effected by a matrix closure of any of the composite keys or combinations of composite keys on the keyboard 16. As mentioned previously, the translate tables, which convert key numbers to the appropriate scancodes supplied to the keyboard microprocessor 12, are built into the two ROM table memories 18 and 20.

With the exception of the modifications illustrated in FIG. 1 providing a simple scancode table memory 18 and a complex scancode memory table 20, the other functions normally associated with the keyboard microprocessor 12 are standard. These include the accumulator timers, serial buffer, control registers, I/O ports, etc. Since these components are standard and operate in a conventional manner, they are neither shown nor described herein.

In the operation of the system, the scan matrix keyboard 16 is processed by a first routine (an INTO routine) when a key on the matrix keyboard 16 is first depressed. This routine performs a matrix scan to find the depressed key in a conventional manner. A de-bounce timer (not shown) is enabled to expire in a short period of time, typically 10 ms. If after the 10 ms the key is found depressed, it is considered to be de-bounced and to be a valid key operation. This type of operation is a standard operation utilized with computer keyboards to ensure proper key operation before providing signals from the keyboard to the keyboard microprocessor 12.

The matrix coordinates of the operated key then are translated to the appropriate key number, which is used to access the simple translation table memory 18 through the decode logic 22. If a make code is stored in the simple scancode table 18, it is loaded into the buffer (not shown) in the keyboard microprocessor for conventional processing. The simple table stored in the table memory 18 is as follows:

TABLE I

SIMPLE TABLE

| Key | Key Number (decimal) | Make Code (hex) |
|---|---|---|
|  | 0 |  |
| ~ | 1 | 29 |
| 1 | 2 | 02 |
| 2 | 3 | 03 |
| 3 | 4 | 04 |
| 4 | 5 | 05 |
| 5 | 6 | 06 |
| 6 | 7 | 07 |
| 7 | 8 |  |
| 8 | 9 |  |
| 9 | 10 |  |
| 0 | 11 |  |
| — | 12 | 0C |
| = | 13 | 0D |
|  | 14 |  |
| Backspace | 15 | 0E |
| Tab | 16 | 0F |
| Q | 17 | 10 |
| W | 18 | 11 |
| E | 19 | 12 |
| R | 20 | 13 |
| T | 21 | 14 |
| Y | 22 | 15 |
| U | 23 |  |
| I | 24 |  |
| O | 25 |  |
| P | 26 |  |
| [ | 27 | 1A |
| ] | 28 | 1B |
| \ | 29 | 2B |
| Caps Lock | 30 | 3A |
| A | 31 | 1E |
| S | 32 | 1F |
| D | 33 | 20 |
| F | 34 | 21 |
| G | 35 | 22 |
| H | 36 | 23 |
| J | 37 |  |
| K | 38 |  |
| L | 39 |  |
| ; | 40 |  |
| ' | 41 | 28 |
|  | 42 |  |
| Enter | 43 | 1C |
| Lft Shft | 44 | 2A |
|  | 45 |  |
| Z | 46 | 2C |
| X | 47 | 2D |
| C | 48 | 2E |
| V | 49 | 2F |
| B | 50 | 30 |
| N | 51 | 31 |
| M | 52 |  |
| , | 53 |  |
| . | 54 |  |
| / | 55 |  |
|  | 56 |  |
| Rt Shft | 57 | 36 |
| Ctrl | 58 | 1D |
|  | 59 |  |
| Lft Alt | 60 | 38 |
| Space Bar | 61 | 39 |
| Rt Alt | 62 |  |
|  | 63 |  |
|  | 64 |  |
|  | 65 |  |
|  | 66 |  |
|  | 67 |  |
|  | 68 |  |
|  | 69 |  |
|  | 70 |  |
|  | 71 |  |
|  | 72 |  |
|  | 73 |  |

TABLE I-continued

SIMPLE TABLE

| Key | Key Number (decimal) | Make Code (hex) |
|---|---|---|
|  | 74 |  |
| Ins | 75 |  |
| Del | 76 |  |
|  | 77 |  |
|  | 78 |  |
| Lft Arw | 79 |  |
| Home | 80 |  |
| End | 81 |  |
|  | 82 |  |
| Up Arw | 83 |  |
| Dwn Arw | 84 |  |
| Pg Up | 85 |  |
| Pg Dwn | 86 |  |
|  | 87 |  |
|  | 88 |  |
| Rt Arw | 89 |  |
| Num Lok | 90 | 45 |
|  | 91 |  |
|  | 92 |  |
|  | 93 |  |
|  | 94 |  |
|  | 94 |  |
|  | 95 |  |
|  | 96 |  |
|  | 97 |  |
|  | 98 |  |
|  | 99 |  |
|  | 100 |  |
|  | 101 |  |
|  | 102 |  |
|  | 103 |  |
|  | 104 |  |
|  | 105 |  |
|  | 106 |  |
|  | 107 |  |
|  | 108 |  |
|  | 109 |  |
| ESC | 110 | 01 |
|  | 111 |  |
| F1 | 112 | 3B |
| F2 | 113 | 3C |
| F3 | 114 | 3D |
| F4 | 115 | 3E |
| F5 | 116 | 3F |
| F6 | 117 | 40 |
| F7 | 118 | 41 |
| F8 | 119 | 42 |
| F9 | 120 | 43 |
| F10 | 121 | 44 |
| F11 | 122 | 57 |
| F12 | 123 | 58 |
| Prt Sc/Sys Req | 124 |  |
| Scroll Lock | 125 | 46 |
| Pause/Break | 126 |  |
| Fn | 127 |  |

If, however, the make code is not defined in the simple table memory 18, the complex translate table memory 20 then is accessed by using both the key number and the current shift state of the keyboard. A make code determined from the complex table 20 then is supplied to the microprocessor 12 as a translated key cede corresponding to a PC/AT key designation.

The scancode associated with most keys of a matrix keyboard may be obtained from simple fixed length table lookups. There are, however, exceptions listed below:

1) Some keys generate as many as six make codes when depressed.

2) Some keys generate up to four break codes when released.

3) Not all keys are typematic.

4) Not all keys generate break codes.

5) The keyboard state (i.e., shift state) affects many translations.

6) There are different scancode tables.

The scancode generation system disclosed in FIG. 1 is based on a new approach to enable the utilization of the scancode table memories 18 and 20 described above. As with the prior art matrix keyboard systems, the system of FIG. 1 employs matrix coordinates, which are assigned unique key numbers. This causes the matrix coordinate of an active or operated key first to be translated to a PC/AT key number (if the active key is a composite key, it uses the same translation process to obtain a key number). Composite key numbers start at 128. The following table (Table 2) is used to translate a typical scan matrix keyboard 16 included with the evaluation systems. The table is accessed by the matrix address (low order four bits of the matrix address is the contents of the keyboard scan OUT register, next high order three bits is the encoded contents of the keyboard scan IN register, bit 7 is always zero). The structure of the table is 1 byte by 128 bytes.

TABLE 2

MATRIX KEY NUMBER TRANSLATION

| Key | Matrix Scan Address | Key Number (decimal) |
|---|---|---|
|  | 00 | 00 |
|  | 01 | 00 |
| ESC | 02 | 110 |
|  | 03 | 00 |
| F4 | 04 | 115 |
| G | 05 | 35 |
| F5 | 06 | 116 |
| H | 07 | 36 |
| F6 | 08 | 117 |
|  | 09 | 00 |
| ' | 0A | 41 |
|  | 0B | 00 |
|  | 0C | 00 |
|  | 0D | 00 |
| Up Arw | 0E | 249 |
| Alt (Left) | 0F | 60 |
|  | 10 | 00 |
| Shift (Left) | 11 | 44 |
| Tab | 12 | 16 |
| Caps Lock | 13 | 30 |
|  | 14 | 114 |
| T | 15 | 21 |
| Backspace | 16 | 15 |
| Y | 17 | 22 |
| ] | 18 | 28 |
| F7 | 19 | 118 |
| [ | 1A | 27 |
|  | 1B | 00 |
|  | 1C | 00 |
|  | 1D | 00 |
| Pause/Break | 1E | 243 |
| Prt Sc/SysReq | 1F | 244 |
| Ctrl (Left) | 20 | 252 |
| F3 | 21 | 114 |
|  | 22 | 01 |
| F1 | 23 | 112 |
| F2 | 24 | 113 |
| 5 | 25 | 6 |
| F9 | 26 | 120 |
| 6 | 27 | 7 |
| = | 28 | 13 |
| F8 | 29 | 119 |
| - | 2A | 12 |
|  | 2B | 00 |
|  | 2C | 00 |

TABLE 2-continued

MATRIX KEY NUMBER TRANSLATION

| Key | Matrix Scan Address | Key Number (decimal) |
|---|---|---|
| Pg Dn | 2D | 246 |
| Home | 2E | 251 |
| Scroll Lock | 2F | 125 |
|  | 30 | 00 |
|  | 31 | 00 |
| 1 | 32 | 2 |
| 2 | 33 | 3 |
| 3 | 34 | 4 |
| 4 | 35 | 5 |
| F10 | 36 | 121 |
| 7 | 37 | 128 |
| 8 | 38 | 129 |
| 9 | 39 | 130 |
| 0 | 3A | 131 |
|  | 3B | 00 |
| F12 | 3C | 123 |
| Pg Up | 3D | 247 |
| End | 3E | 250 |
| Del | 3F | 253 |
|  | 40 | 00 |
|  | 41 | 00 |
| Q | 42 | 17 |
| W | 43 | 18 |
| E | 44 | 19 |
| R | 45 | 20 |
|  | 46 | 00 |
| U | 47 | 132 |
| I | 48 | 133 |
| O | 49 | 134 |
| P | 4A | 135 |
| F11 | 4B | 122 |
|  | 4C | 00 |
|  | 4D | 00 |
|  | 4E | 00 |
| Ins | 4F | 254 |
|  | 50 | 00 |
| Fn | 51 | 127 |
| A | 52 | 131 |
| S | 53 | 32 |
| D | 54 | 33 |
| F | 55 | 34 |
|  | 56 | 00 |
| J | 57 | 136 |
| K | 58 | 137 |
| L | 59 | 138 |
| ; | 5A | 139 |
|  | 5B | 00 |
|  | 5C | 00 |
|  | 5D | 00 |
|  | 5E | 00 |
|  | 5F | 00 |
|  | 60 | 00 |
| Shift (Right) | 61 | 57 |
| Z | 62 | 46 |
| X | 63 | 47 |
| C | 64 | 48 |
| V | 65 | 49 |
| Enter | 66 | 43 |
| M | 67 | 140 |
| , | 68 | 141 |
| . | 69 | 142 |
|  | 6A | 00 |
| Num Lok | 6B | 90 |
|  | 6C | 00 |
|  | 6D | 00 |
|  | 6E | 00 |
|  | 6F | 00 |
|  | 70 | 00 |
|  | 71 | 00 |
| \ | 72 | 29 |
|  | 73 | 00 |
|  | 74 | 00 |
| B | 75 | 50 |
| Space Bar | 76 | 61 |
| N | 77 | 51 |
|  | 78 | 00 |
|  | 79 | 00 |
| / | 7A | 143 |
| Dwn Arw | 7B | 248 |
| Rt Arw | 7C | 245 |
|  | 7D | 00 |
| Lft Arw | 7E | 252 |
|  | 7F | 00 |
| Alt (Right) | ?? | 255 |

In addition to an assignment of key numbers for each of the matrix coordinates, the system employs six additional unique classification parameters to enable the use of the simple table memory 18 and complex table memory 20 to store the information necessary to translate into PC/AT format all of the simple and complex key operations for processing by the keyboard microprocessor 12. These parameters are as follows:

1) Key numbers are assigned to one of two classes (i.e. simple and complex).

2) Two classes of scancode tables are used (simple and complex).

3) Complex scancode generation is defined by a set of seven Edit Rules.

4) The keyboard state is defined by a 32 bit field.

5) The complex table includes the Edit Rule and keyboard state fields.

6) Simple key numbers use the simple table, complex keys use the complex table.

The keyboard state field (complex table) contains all of the possible keyboard states for which translation from the matrix keyboard closure to a PC/AT scancode is applicable. There are thirty-two keyboard states generated by a combination of the following five keys found on matrix keyboards:

Fn . . . special function key

Num . . . numlock

Shft . . . Shift (either the right or left or both shift keys)

Ctrl . . . Control key

Alt . . . Alternate key shift (either the right or left or both)

If all five shift keys are de-asserted (not operated), the keyboard state is 00 (bit 0 in the keyboard state field is set). If only the Alt key is down, the keyboard state is 01 (bit 1 is set), and so forth. All of the combinations to produce the different keyboard state fields are provided in the following table:

TABLE 3

KEYBOARD STATE

| Fn | Num | Shft | Ctrl | Alt | Keyboard State | Shift keys (asserted) |
|---|---|---|---|---|---|---|
| 0 | 0 | 0 | 0 | 0 | 00 00 00 01 |  |
| 0 | 0 | 0 | 0 | 1 | 00 00 00 02 | Alt |
| 0 | 0 | 0 | 1 | 0 | 00 00 00 04 | Ctrl |
| 0 | 0 | 0 | 1 | 1 | 00 00 00 08 | Ctrl, Alt |
| 0 | 0 | 1 | 0 | 0 | 00 00 00 10 | Shft |
| 0 | 0 | 1 | 0 | 1 | 00 00 00 20 | Shft, Alt |
| 0 | 0 | 1 | 1 | 0 | 00 00 00 40 | Shft, Ctrl |

TABLE 3-continued

KEYBOARD STATE

| Fn | Num | Shft | Ctrl | Alt | Keyboard State | Shift keys (asserted) |
|---|---|---|---|---|---|---|
| 0 | 0 | 1 | 1 | 1 | 00 00 00 80 | Shft, Ctrl, Alt |
| 0 | 1 | 0 | 0 | 0 | 00 00 01 00 | Num |
| 0 | 1 | 0 | 0 | 1 | 00 00 02 00 | Num, Alt |
| 0 | 1 | 0 | 1 | 0 | 00 00 04 00 | Num, Ctrl |
| 0 | 1 | 0 | 1 | 1 | 00 00 08 00 | Num, Ctrl, Alt |
| 0 | 1 | 1 | 0 | 0 | 00 00 10 00 | Num, Shft |
| 0 | 1 | 1 | 0 | 1 | 00 00 20 00 | Num, Shft, Alt |
| 0 | 1 | 1 | 1 | 0 | 00 00 40 00 | Num, Shft, Ctrl |
| 0 | 1 | 1 | 1 | 1 | 00 00 80 00 | Num, Shft, Ctrl, Alt |
| 1 | 0 | 0 | 0 | 0 | 00 01 00 00 | Fn |
| 1 | 0 | 0 | 0 | 1 | 00 02 00 00 | Fn, Alt |
| 1 | 0 | 0 | 1 | 0 | 00 04 00 00 | Fn, Ctrl |
| 1 | 0 | 0 | 1 | 1 | 00 08 00 00 | Fn, Ctrl, Alt |
| 1 | 0 | 1 | 0 | 0 | 00 10 00 00 | Fn, Shft |
| 1 | 0 | 1 | 0 | 1 | 00 20 00 00 | Fn, Shft, Alt |
| 1 | 0 | 1 | 1 | 0 | 00 40 00 00 | Fn, Shft, Ctrl |
| 1 | 0 | 1 | 1 | 1 | 00 80 00 00 | Fn, Shft, Ctrl, Alt |
| 1 | 1 | 0 | 0 | 0 | 01 00 00 00 | Fn, Num |
| 1 | 1 | 0 | 0 | 1 | 02 00 00 00 | Fn, Num, Alt |
| 1 | 1 | 0 | 1 | 0 | 04 00 00 00 | Fn, Num, Ctrl |
| 1 | 1 | 0 | 1 | 1 | 08 00 00 00 | Fn, Num, Ctrl, Alt |
| 1 | 1 | 1 | 0 | 0 | 10 00 00 00 | Fn, Num, Shft |
| 1 | 1 | 1 | 0 | 1 | 20 00 00 00 | Fn, Num, Shft, Alt |
| 1 | 1 | 1 | 1 | 0 | 40 00 00 00 | Fn, Num, Shft, Ctrl |
| 1 | 1 | 1 | 1 | 1 | 80 00 00 00 | Fn, Num, Shft, Ctrl, Alt |

In addition, the complex table memory 20 also includes seven specific Edit Rules, which complete the definition of the complex scancode generation effected through the complex table memory 20. These rules are as follows:

TABLE 4

EDIT RULES

Rule 1. Make and break code is preceded by the EO code.

Rule 2. Force keyboard unshifted mode (i.e. if either or both shift keys are depressed, the appropriate shift break sequences must precede the translated scancode, . . . the appropriate shift make sequences must then follow).

Rule 3. Force shifted keyboard state by preceding the scancode with a shift make sequence (shift break to follow scancode).

Rule 4. Pause/break key (this is an odd key which requires up to 8 make codes when the Ctrl key is NOT depressed, . . . it behaves well if the Ctrl key is depressed).

Rule 5. internal key (no scancodes generated).

Rule 6. Non-typematic key.

Rule 7. No break code

It should be noted that a two-byte field contains the coae translation for make codes. The break code typically is translated from the make code. The translation is dependent upon the enabled scancode table (that is, from simple table memory 18 or complex table memory 20). The transactions which map to a single make code have a binary 0 stored in the second byte of this field. This is established in the system.

As noted, some of the keys of the matrix keyboard require special attention. This is the reason for the Edit Rules noted in Table 4 above. For example, the backslash (\) key on the numeric pad of the keyboard 16 typically requires that a shift break sequence precedes the scancode if the operator has a shift key depressed. If the shift break sequence is not sent, a question mark (?), instead of a backslash character (\), will appear on the screen. Other examples of particular attention for other keys depend upon the particular key assignments and the combinations of operations of the five keys of Table 3 to produce the desired one of the thirty-two keyboard states shown in Table 3 above.

As noted above, the assignments of key numbers, which access the complex table, cause the complex table memory 20 to be accessed when no translation exists in the simple table 18. The complex table memory 20, as mentioned above, is ordered by key number. Since there can be no entries or multiple entries for a given key number, this table is searched. Once a matching key number has been found, the current state of the keyboard (including the state of the five keys discussed in conjunction with Table 3 above) must be checked against the keyboard state entry. As noted, the keyboard state entry constitutes the various combinations of operation of the keys shown in Table 3. If the keyboard states do not match, the search continues in the complex table memory 20. Only the make code is stored in the table memory 20. The break code is derived from the make in a well known manner. The size of the complex table stored in the memory 20 is variable, depending upon the particular arrangement and operating combinations which are present in any given matrix keyboard. For a particular keyboard (SAMPECH keyboard), the following complex table is stored in the complex table memory 20:

TABLE 5

COMPLEX TABLE

| Key | Key Number | Keyboard State(s) | Make Code 1 | Edit Rules |
|---|---|---|---|---|
| 7 | 128 | Fn, -Num, -Ctrl, -Alt, -Shft | 47 | |
| 7 | | (FF FF 00 00) | | (00) |
| 7 | 128 | \Fn, -Num, -Ctrl, -Alt, -Shft | 08 | |
| 7 | | (00 00 FF FF) | | (00) |
| 8 | 129 | Fn, -Num, -Ctrl, -Alt, -Shft | 48 | |
| 8 | | (FF FF 00 00) | | (00) |
| 8 | 129 | \Fn, -Num, -Ctrl, -Alt, -Shft | 09 | |
| 8 | | (00 00 FF FF) | | (00) |
| 9 | 130 | Fn, -Num, -Ctrl, -Alt, -Shft | 49 | |
| 9 | | (FF FF 00 00) | | (00) |
| 9 | 130 | \Fn, -Num, -Ctrl, -Alt, -Shft | 0A | |
| 9 | | (00 00 FF FF) | | (00) |
| 0 | 131 | Fn, -Num, -Ctrl, -Alt, -Shft | 37 | |
| * | | (FF FF 00 00) | | (00) |
| 0 | 131 | \Fn, -Num, -Ctrl, -Alt, -Shft | 0B | |
| * | | (00 00 FF FF) | | (00) |
| U | 132 | Fn, -Num, -Ctrl, -Alt, -Shft | 4B | |
| 4 | | (FF FF 00 00) | | (00) |
| U | 132 | \Fn, -Num, -Ctrl, -Alt, -Shft | 16 | |
| 4 | | (00 00 FF FF) | | (00) |
| 1 | 133 | Fn, -Num, -Ctrl, | 4C | |

TABLE 5-continued

COMPLEX TABLE

| Key | Key Number | Keyboard State(s) | Make Code 1 | Edit Rules |
|---|---|---|---|---|
| 5 | | -Alt, -Shft (FF FF 00 00) | | (00) |
| I — 5 | 133 | \Fn, -Num, -Ctrl, -Alt, -Shft (00 00 FF FF) | 17 | (00) |
| O — 6 | 134 | Fn, -Num, -Ctrl, -Alt, -Shft (FF FF 00 00) | 4D | (00) |
| O — 6 | 134 | \Fn, -Num, -Ctrl, -Alt, -Shft (00 00 FF FF) | 18 | (00) |
| P — - | 135 | Fn, -Num, -Ctrl, -Alt, -Shft (FF FF 00 00) | 4A | (00) |
| P — - | 135 | \Fn, -Num, -Ctrl, -Alt, -Shft (00 00 FF FF) | 19 | (00) |
| J — 1 | 136 | Fn, -Num, -Ctrl, -Alt, -Shft (FF FF 00 00) | 4F | (00) |
| J — 2 | 136 | \Fn, -Num, -Ctrl, -Alt, -Shft (00 00 FF FF) | 24 | (00) |
| K — 2 | 137 | Fn, -Num, -Ctrl, -Alt, -Shft (FF FF 00 00) | 50 | (00) |
| L — 3 | 137 | \Fn, -Num, -Ctrl, -Alt, -Shft (00 00 FF FF) | 25 | (00) |
| L — 3 | 138 | Fn, -Num, -Ctrl, -Alt, -Shft (FF FF 00 00) | 51 | (00) |
| L — 3 | 138 | \Fn, -Num, -Ctrl, -Alt, -Shft (00 00 FF FF) | 26 | (00) |
| ; — + | 139 | Fn, -Num, -Ctrl, -Alt, -Shft (FF FF 00 00) | 4E | (00) |
| ; — + | 139 | \Fn, -Num, -Ctrl, -Alt, -Shft (00 00 FF FF) | 27 | (00) |
| M — 0 | 140 | Fn, -Num, -Ctrl, -Alt, -Shft (FF FF 00 00) | 52 | (00) |
| M — 0 | 140 | \Fn, -Num, -Ctrl, -Alt, -Shft (00 00 FF FF) | 32 | (00) |
| , — , | 141 | Fn, -Num, -Ctrl, -Alt, -Shft (FF FF 00 00) | 33 | (00) |
| , — , | 141 | \Fn, -Num, -Ctrl, -Alt, -Shft (00 00 FF FF) | 33 | (00) |
| . — . | 142 | Fn, -Num, -Ctrl, -Alt, -Shft (FF FF 00 00) | 53 | (00) |
| . — . | 142 | \Fn, -Num, -Ctrl, -Alt, -Shft (00 00 FF FF) | 34 | (00) |
| / — / | 143 | Fn, -Num, -Ctrl, -Alt, -Shft (FF FF 00 00) | 35 | Rule 1 (01) |
| / — / | 143 | Fn, -Num, -Ctrl, -Alt, -Shft (FF FF 00 00) | 35 | Rule 1 (01) |
| Fn | 144 | \Fn, -Num, -Ctrl, -Alt, -Shft (FF FF FF FF) | | (E0) |
| Ctrl | 242 | \Fn, -Num, -Ctrl, -Alt, -Shft (00 00 FF FF) | 1D | (00) |
| Ctrl | 242 | Fn, -Num, -Ctrl, -Alt, -Shft (FF FF 00 00) | 1D | (01) |
| Pause Break | 243 | -Fn, -Num, \Ctrl, -Alt, -Shft (BB BB BB BB) | 45 | Rule 4 Rule 7 Rule 6 (C8) |
| Pause Break | 243 | -Fn, -Num, Ctrl, -Alt, -Shft (44 44 44 44) | 46 | Rule 4 Rule 7 Rule 6 (C8) |
| Prt Sc SysRq | 244 | -Fn, -Num, \Ctrl, \Alt, \Shft (01 01 01 01) | 37 | Rule 1 Rule 3 (05) |
| Prt Sc SysRq | 244 | -Fn, -Num, \Ctrl, \Alt, Shft <or> -Fn, -Num, Ctrl, \Alt, Shft <or> -Fn, -Num, Ctrl \Alt, Shft (54 54 54 54) | 37 | Rule 1 (01) |
| Prt Sc SysRq | 244 | -Fn, -Num, -Ctrl, Alt, -Shft (AA AA AA AA) | 54 | (00) |
| Rt Arw | 245 | -Fn, \Num, -Ctrl, -Alt, \Shft (00 F0 00 F0) | 4D | Rule 1 Rule 2 (03) |
| Rt Arw | 245 | -Fn, Num, -Ctrl, -Alt, \Shft (0F 00 0F 00) | 4D | Rule 1 Rule 3 (05) |
| Rt Arw | 245 | -Fn, \Num, -Ctrl, -Alt, \Shft <or> -Fn, Num, -Ctrl, -Alt, Shft (F0 0F F0 0F) | 4D | Rule 1 (01) |
| Pg | 246 | -Fn, | 51 | Rule 1 |

TABLE 5-continued

COMPLEX TABLE

| Key | Key Number | Keyboard State(s) | Make Code 1 | Edit Rules |
|---|---|---|---|---|
| Dn | | \Num, -Ctrl, -Alt, Shft (00 F0 00 F0) | | Rule 2 (03) |
| Pg Dn | 246 | -Fn, Num, -Ctrl, -Alt, \Shft (0F 00 0F 00) | 51 | Rule 1 Rule 3 (05) |
| Pg Dn | 246 | -Fn, \Num, -Ctrl, -Alt, \Shft <or> -Fn, Num, -Ctrl, -Alt, Shft (F0 0F F0 0F) | 51 | Rule 1 (01) |
| Pg Up | 247 | -Fn, \Num, -Ctrl, -Alt, Shft (00 F0 00 F0) | 49 | Rule 1 Rule 2 (03) |
| Pg Up | 247 | -Fn, Num, -Ctrl, -Alt, \Shft (0F 00 0F 00) | 49 | Rule 1 Rule 3 (05) |
| Pg Up | 247 | -Fn, \Num, -Ctrl, -Alt, \Shft <or> -Fn, Num, -Ctrl, -Alt, Shft (F0 0F F0 0F) | 49 | Rule 1 (01) |
| Dn Arw | 248 | -Fn, \Num, -Ctrl, -Alt, Shft (00 F0 00 F0) | 50 | Rule 1 Rule 2 (03) |
| Dn Arw | 248 | -Fn, Num, -Ctrl, -Alt, \Shft (0F 00 0F 00) | 50 | Rule 1 Rule 3 (05) |
| Dn Arw | 248 | -Fn, \Num, -Ctrl, -Alt, \Shft <or> -Fn, Num, -Ctrl, -Alt, Shft (F0 0F F0 0F) | 50 | Rule 1 (01) |
| Up Arw | 249 | -Fn, \Num, -Ctrl, -Alt, Shft (00 F0 00 F0) | 48 | Rule 1 Rule 2 (03) |
| Up Arw | 249 | -Fn, Num, -Ctrl, -Alt, \Shft (0F 00 0F 00) | 48 | Rule 1 Rule 3 (05) |
| Up Arw | 249 | -Fn, \Num, -Ctrl, -Alt, \Shft <or> -Fn, Num, -Ctrl, -Alt, -Shft (F0 0F F0 0F) | 48 | Rule 1 (01) |
| End | 250 | -Fn, \Num, -Ctrl, -Alt, Shft (00 F0 00 F0) | 4F | Rule 1 Rule 2 (03) |
| End | 250 | -Fn, Num, -Ctrl, -Alt, \Shft (0F 00 0F 00) | 4F | Rule 1 Rule 3 (05) |
| End | 250 | -Fn, \Num, -Ctrl, -Alt, \Shft <or> -Fn, Num, -Ctrl, -Alt, Shft (F0 0F F0 0F) | 4F | Rule 1 (01) |
| Home | 251 | -Fn, \Num , -Ctrl -Alt, Shft (00 F0 00 F0) | 47 | Rule 1 Rule 2 (03) |
| Home | 251 | -Fn, Num, -Ctrl, -Alt, \Shft (0F 00 0F 00) | 47 | Rule 1 Rule 3 (05) |
| Home | 251 | -Fn, \Num, -Ctrl, -Alt, \Shft <or> -Fn, Num, -Ctrl, -Alt, Shft (F0 0F F0 0F) | 47 | Rule 1 (01) |
| Lft Arw | 252 | -Fn, \Num, -Ctrl, -Alt, Shft (00 F0 00 F0) | 4B | Rule 1 Rule 2 (03) |
| Lft Arw | 252 | -Fn, Num, -Ctrl, -Alt, \Shft (0F 00 0F 00) | 4B | Rule 1 Rule 3 (05) |
| Lft Arw | 252 | -Fn, \Num, -Ctrl, -Alt, \Shft <or> -Fn, Num, -Ctrl, -Alt, Shft (F0 0F F0 0F) | 4B | Rule 1 (01) |
| Del | 253 | -Fn, \Num, -Ctrl, -Alt, Shft (00 F0 00 F0) | 53 | Rule 1 Rule 2 (03) |
| Del | 253 | -Fn, Num, -Ctrl, -Alt, \Shft (0F 00 0F 00) | 53 | Rule 1 Rule 3 (05) |
| Del | 253 | -Fn, \Num, -Ctrl, -Alt, \Shft <or> -Fn, Num, -Ctrl, -Alt, Shft (F0 0F F0 0F) | 53 | Rule 1 (01) |
| Ins | 254 | -Fn, \Num, -Ctrl, -Alt, Shft (00 F0 00 F0) | 52 | Rule 1 Rule 2 (03) |
| Ins | 254 | -Fn, Num, -Ctrl, -Alt, \Shft (0F 00 0F 00) | 52 | Rule 1 Rule 3 (05) |
| Ins | 254 | -Fn, \Num, -Ctrl, -Alt, \Shft <or> | 52 | Rule 1 (01) |

TABLE 5-continued

COMPLEX TABLE

| Key | Key Number | Keyboard State(s) | Make Code 1 | Edit Rules |
|---|---|---|---|---|
| Alt (Right) | 255 | -Fn, Num, -Ctrl, -Alt, Shft (F0 0F F0 0F) -Fn, -Num, -Ctrl, -Alt, -Shft (FF FF FF FF) | 38 | Rule 1 (01) |

In Table 5 a minus (−) in front of the abbreviation for the identified state field key represents a "don't care" state. This means that for the particular translation, the state of operation of the key with the minus sign in front of it can be either depressed (operated) or not depressed (unoperated). A backslash (\) in front of the abbreviation means that the state must be inactive (i.e. de-asserted or not operated). If neither a minus or a backslash appears in front of the abbreviation, the key is active (asserted or operated).

The operation of the matrix keyboard 16 is effected to provide a simple key address which is processed through the simple table memory 18 to the microprocessor 12, or to provide a complex key address which is produced by a combination of various keys on the keyboard, including one or more of the five keys identified in Table 3 above. Thus, automatic translation of all of the key operations on the matrix keyboard 16 is effected to produce the standard desk-top compatible PC/AT key scancode signals to the keyboard microprocessor 12 for further processing by the MPU 10 of the computer. If a matrix computer 16 having a different combination of simple and complex entries is provided, no hardware or software changes need to be made; but a simple storage of the simple table in the memory 18 and the complex table in the memory 20, in accordance with the parameters defined above, is effected to cause the desired translation for the given keyboard 16. The system consequently operates to interface different matrix keyboards, having different standards or different types of combinations for similar functions, to be used with the same basic computer and keyboard microprocessor components without requiring extensive hardware or software modification to accomplish the interface between the keyboard and the computer.

Figure 2:
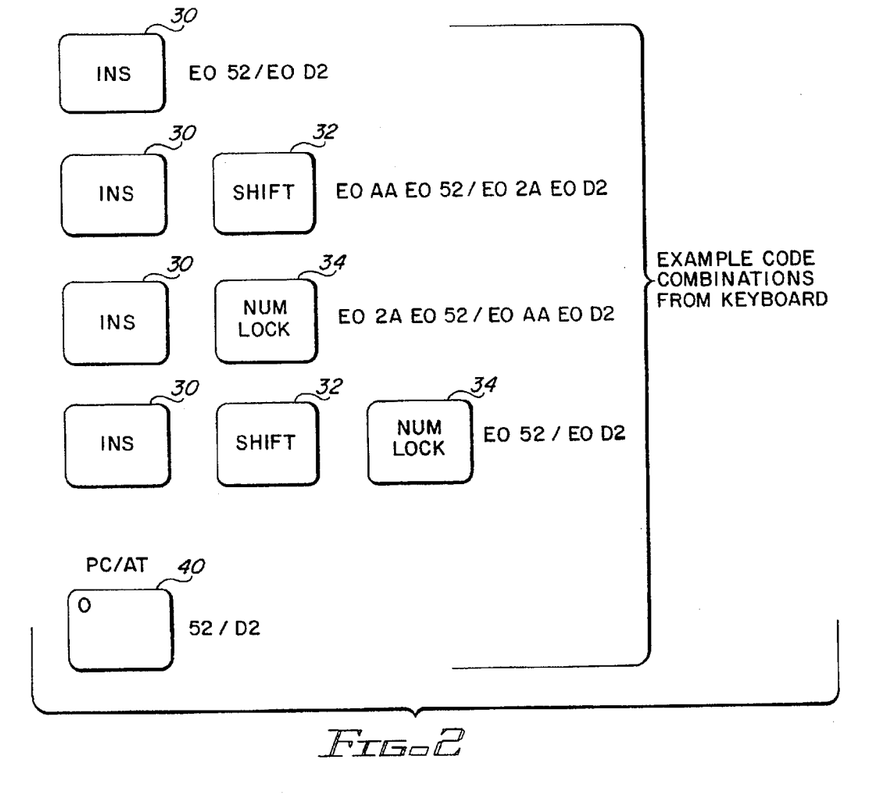
FIG. 2 illustrates an example of various code combinations from the keyboard.

FIG. 2 is a graphic example of different code combinations from the matrix keyboard 16 for three of the five keys which determine the keyboard state, described above in conjunction with Table 3. In the example shown in FIG. 2, at the very bottom is the standard PC/AT insert key, which generates the standard key code signal 52/D2 shown to the right of the key 40. When the comparable key 30 is operated in the matrix keyboard 16 without concurrent operation of any of the keyboard state field keys, the output is the one indicated at the top of the representation of FIG. 2 as E052/E0D2. In descending sequence, the combination of this key 30 with the SHIFT key 32 or the NUMLOCK key 34, or both the SHIFT key 32 and NUMLOCK key 34, are illustrated in FIG. 2. These combination operations illustrate the different signal combinations that are used to address the complex table of Table 5 to produce the desired scancode results from the table memory 20 for processing by the keyboard microprocessor 12. The manner in which this is decoded in the complex table is shown in the three entries for Key No. 254 in Table 5.

The foregoing description of the preferred embodiment of the invention, along with the accompanying drawing, is to be considered as illustrative and not as limiting. Various changes and modifications will occur no those skilled in the art to perform substantially the same function, in substantially the same way, to achieve substantially the same result, without departing from the true scope of the invention as defined in the appended claims.

What is claimed is:

1. A scan code translation system for generating key codes for a personal computer from a matrix keyboard based on the current state of operation of the keyboard, said system including in combination:

a first scan code translation table memory storing a first keyboard make scan code table representative of operation of predetermined selected keys of a keyboard;

a second scan code translation table memory storing a second keyboard make scan code code table representative of operation of predetermined combinations of keys of a keyboard;

address decode logic coupled with said matrix keyboard, having a plurality of keys and coupled with said first and second table memories for addressing said first and second scan code translation table memories in response to operation of said predetermined selected keys and said predetermined combinations of keys of said keyboard, with said first table memory first being accessed by said decode logic to determine if a make scan code corresponding to an operated key is stored therein; with detection of a make scan code in said first table memory producing an output signal representative of said stored make scan code;

said address decode logic accessing said second table memory whenever no make scan code corresponding to operated keys is located in said first table memory in response to operation of said predetermined selected keys of said keyboard to determine if a make scan code corresponding to said operation of said predetermined combination of keys is stored therein, with detection of a make scan code in said second table memory producing an output signal representative of said stored make scan code; and a microprocessor coupled to receive the output signals from said first and second table memories for producing output signals in the form of signals representative of operations of individual keys and combinations of keys of said keyboard for utilization by said personal computer.

2. The combination according to claim 1 wherein said first and second memories comprise at least a portion of a read-only memory (ROM) of said microprocessor.

3. The combination according to claim 2 wherein said first keyboard scan code table is a simple table and said second keyboard scan code table is a complex table.

4. The combination according to claim 3 wherein said microprocessor is a keyboard microprocessor.

5. The combination according to claim 1 wherein said first and second memories comprise at least a portion of an internal random access memory (RAM) of said keyboard microprocessor.

6. The combination according to claim 5 wherein said first keyboard scan code table is a simple table and said second keyboard scan code table is a complex table.

7. The combination according to claim 6 wherein said microprocessor is a keyboard microprocessor.

8. The combination according to claim 1 wherein said first keyboard scan code table is a simple table and said second keyboard scan code table is a complex table.

9. The combination according to claim 1 wherein said microprocessor is a keyboard microprocessor.

10. A method for scan code translation of key codes of a personal computer from a matrix keyboard having a plurality of keys, said method including the steps of:

storing a first make scan code translation table of one of two types in a memory;

storing a second make scan code translation table of the other of said two types in a memory;

addressing said first scan code translation table in response to operation of predetermined keys of a matrix keyboard to cause an output representative of a translated key code to be obtained from said memory storing said first translation table in response to a make scan code stored therein corresponding with an operated key of said matrix keyboard;

addressing said second scan code translation table in said memory in response to operation of predetermined keys of said matrix keyboard if no corresponding make scan code is first found in said first scan code translation table to determine if a make scan code corresponding to operation of combinations of keys of said matrix keyboard is stored in said second translation table to produce an output signal representative of a translated key code corresponding to operation of predetermined selected keys of said keyboard; and using said translated scan code signals from said memories as translated key codes for utilization by a computer.

11. The method according to claim 10 wherein the step of addressing said second scan code translation table is effected by determining the current state of operation of predetermined combinations of keys of said matrix keyboard and using predetermined editing rules to provide said translated key codes for utilization by said personal computer.

* * * * *